(12) United States Patent
Fujimoto et al.

(10) Patent No.: US 7,770,450 B2
(45) Date of Patent: Aug. 10, 2010

(54) TUNING BAR VIBRATOR AND VIBRATING GYROSCOPE USING THE SAME

(75) Inventors: Katsumi Fujimoto, Toyama (JP); Masato Koike, Toyama-Ken (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 55 days.

(21) Appl. No.: 12/355,034

(22) Filed: Jan. 16, 2009

(65) Prior Publication Data

US 2009/0133497 A1 May 28, 2009

Related U.S. Application Data

(63) Continuation of application No. PCT/JP2007/057825, filed on Apr. 9, 2007.

(30) Foreign Application Priority Data

Jul. 21, 2006 (JP) .............................. 2006-199147

(51) Int. Cl.
G01C 19/56 (2006.01)
(52) U.S. Cl. ................................. 73/504.12; 73/504.16
(58) Field of Classification Search .............. 73/504.12, 73/504.04, 504.16, 504.02, 504.14, 504.15; 310/370

See application file for complete search history.

(56) References Cited

U.S. PATENT DOCUMENTS

| | | | |
|---|---|---|---|
| 3,944,862 A * | 3/1976 | Shimoi et al. | 310/312 |
| 3,946,257 A * | 3/1976 | Kawamura | 310/370 |
| 4,410,827 A * | 10/1983 | Kogure | 310/370 |
| 4,771,202 A * | 9/1988 | Takahashi | 310/312 |
| 5,698,784 A * | 12/1997 | Hotelling et al. | 73/504.16 |

(Continued)

FOREIGN PATENT DOCUMENTS

JP 07-332988 12/1995

(Continued)

OTHER PUBLICATIONS

PCT/JP2007/057825 International Search Report dated Apr. 23, 2007.

(Continued)

*Primary Examiner*—Helen C. Kwok
(74) *Attorney, Agent, or Firm*—Dickstein, Shapiro, LLP.

(57) ABSTRACT

A tuning bar vibrator formed on a substrate and including a vibrating body. The vibrating body is formed into a meander shape as a whole, and a middle vibrating reed is used as a first detection unit. At one end side of the vibrating body, two sensing electrodes are formed and connected respectively to two extended electrodes. A further sensing electrode and a common electrode are formed on a first principal surface of the first detection unit. A common electrode formed on a second principal surface of the vibrating body is connected to the common electrode on the first principal surface via a through-hole. The further sensing electrode and the common electrode are connected respectively to another set of extended electrodes. A tuning bar vibrator that is small in size, may be reduced in profile and may be used as a vibrating gyroscope having a desirable detection sensitivity, and a vibrating gyroscope using the tuning bar vibrator are obtained.

15 Claims, 7 Drawing Sheets

U.S. PATENT DOCUMENTS

| | | | |
|---|---|---|---|
| 6,531,805 B2 * | 3/2003 | Ikeda et al. | 310/331 |
| 7,210,350 B2 * | 5/2007 | Ogura | 73/504.12 |
| 7,478,558 B2 * | 1/2009 | Fujii et al. | 73/504.16 |
| 2004/0007065 A1 | 1/2004 | Fujimoto et al. | |
| 2009/0126488 A1 * | 5/2009 | Fujimoto et al. | 73/504.16 |
| 2009/0167118 A1 * | 7/2009 | Yoshimatsu et al. | 310/370 |

FOREIGN PATENT DOCUMENTS

| | | |
|---|---|---|
| JP | 2001-050751 | 2/2001 |
| JP | 2001-082963 | 3/2001 |
| JP | 2004-061486 | 2/2004 |
| JP | 2004-242256 | 8/2004 |

OTHER PUBLICATIONS

PCT/JP2007/057825 Written Opinion dated Apr. 23, 2007.

* cited by examiner

TUNING BAR VIBRATOR AND VIBRATING GYROSCOPE USING THE SAME

CROSS REFERENCE TO RELATED APPLICATIONS

The present application is a continuation of International Application No. PCT/JP2007/057825, filed Apr. 9, 2007, which claims priority to Japanese Patent Application No. JP2006-199147, filed Jul. 21, 2006, the entire contents of each of these applications being incorporated herein by reference in their entirety.

FIELD OF THE INVENTION

The invention relates to a tuning bar vibrator and a vibrating gyroscope using the same and, more particularly, to, for example, a tuning bar vibrator that utilizes bending vibration and a vibrating gyroscope using the same.

BACKGROUND OF THE INVENTION

FIG. 12 is a perspective view that shows an example of an existing tuning bar vibrator. The tuning bar vibrator 1 includes two rectangular piezoelectric substrates 2a and 2b. These piezoelectric substrates 2a and 2b are laminated via an electrode 3. These piezoelectric substrates 2a and 2b are polarized in opposite directions to each other as shown by the arrows in FIG. 12. Two split electrodes 4 are formed on the principal surface of the piezoelectric substrate 2a. These split electrodes 4 are separated at the center of the piezoelectric substrate 2a in the width direction, and is formed so as to extend in the longitudinal direction of the piezoelectric substrate 2a. In addition, a common electrode 5 is formed on the entire area of the principal surface of the other piezoelectric substrate 2b. The tuning bar vibrator 1 connects an oscillation circuit between the split electrodes 4 and the common electrode 5, so it bends and vibrates in a direction perpendicular to the principal surfaces of the piezoelectric substrates 2a and 2b. Support members 6 are formed at nodes of the bending vibration.

The tuning bar vibrator 1 is, for example, used as a vibrating gyroscope. In this case, an oscillation circuit is connected between the split electrodes 4 and the common electrode 5. In addition, the split electrodes are connected to a differential circuit, and a difference in output signal between the split electrodes 4 is detected. Owing to a driving signal of the oscillation circuit, the tuning bar vibrator 1 bends and vibrates in the direction perpendicular to the principal surface of the piezoelectric substrates 2a and 2b. Here, the tuning bar vibrator 1 is bent and vibrated by self-oscillation that vibrates at its resonant frequency. In this state, when an rotational angular velocity is applied about the central axis of the tuning bar vibrator 1, Coriolis force acts in a direction perpendicular to the direction of bending vibration at the time when the tuning bar vibrator 1 is not rotated. Thus, the direction of bending vibration of the tuning bar vibrator 1 changes, signals in opposite phase, corresponding to Coriolis force are output from the two split electrodes 4, and then a difference in these signals is output from the differential circuit. Thus, by measuring the output signal of the differential circuit, it is possible to detect a rotational angular velocity applied to the tuning bar vibrator 1 (see Patent Document 1).

Patent Document 1: Japanese Unexamined Patent Application Publication No. 7-332988

SUMMARY OF THE INVENTION

With a reduction in size of a video camera, or the like, equipped with a vibrating gyroscope, there has been an increasing need for miniaturization and profile reduction of the vibrating gyroscope. Here, the resonant frequency ωr of the above tuning bar vibrator is expressed as follows, where the length of the tuning bar vibrator is L, the thickness is H, the density is ρ, the Young's modulus is E and the moment of inertia is I.

$$\omega r = \left(\frac{3.927}{L}\right)^2 \sqrt{\frac{EI}{\rho H^2}}$$ [Expression 1]

From the above expression, it appears that as the tuning bar vibrator is reduced in size, the resonant frequency increases. On the other hand, as the resonant frequency of the tuning bar vibrator increases, a difference in frequency between the resonant frequency and a frequency of hand jiggling applied to a video camera, or the like. Thus, detection sensitivity for the rotational angular velocity decreases. The resonant frequency of a typical vibrating gyroscope is 50 kHz or below, and, for example, a typical piezoelectric ceramic bimorph vibrator has a resonant frequency of about 30 kHz with a thickness of 0.4 mm and a length of 7 mm.

In this way, when the size of the tuning bar vibrator is reduced, the detection sensitivity for a rotational angular velocity decreases, whereas the resonant frequency is reduced in order to increase the detection sensitivity for a rotational angular velocity, the size of the tuning bar vibrator is increased. In addition, in the tuning bar vibrator in which piezoelectric substances are laminated, the thickness of the piezoelectric substances is inevitable and, as a result, a reduction in profile of the vibrating gyroscope is limited.

For the above reasons, it is a main object of the invention to provide a tuning bar vibrator that is small in size, may be reduced in profile and may be used as a vibrating gyroscope having a desirable detection sensitivity, and a vibrating gyroscope using the tuning bar vibrator.

The invention provides a tuning bar vibrator. The tuning bar vibrator includes: a meander-shaped vibrating body that has one principal surface and the other principal surface; two driving electrodes that are formed so as to extend from one end side of the one principal surface of the vibrating body in a longitudinal direction thereof to a middle portion of the one principal surface of the vibrating body and that are split in a width direction of the vibrating body; a sensing electrode that is formed so as to extend from the other end side of the one principal surface of the vibrating body in the longitudinal direction thereof to the middle portion of the one principal surface; a metal film that is formed on the other principal surface of the vibrating body; and a support portion that is formed at a portion, which is a node when the vibrating body bends and vibrates, and that supports the vibrating body in a hollow manner. By applying a driving signal to the driving electrodes, it is possible to excite the vibrating body to undergo bending vibration. Here, by forming the vibrating body into a meander shape, even when the tuning bar vibrator is miniaturized as a whole, it is possible to ensure the length of a vibrator necessary for maintaining a low resonant frequency. Thus, even when the tuning bar vibrator is miniaturized as a whole, it is possible to prevent the resonant frequency from being increased. Note that the driving electrodes are formed so as to extend from one end side of the vibrating body in the longitudinal direction to the center portion thereof, and the sensing electrode is formed so as to extend from the other end side of the vibrating body in the longitudinal direction to the center portion thereof, and here, the one end side and the other end side mean one end side and the other end side in the longitudinal direction with respect to the center portion of the vibrating body and do not mean the ends of the vibrating body. Thus, it does not describe that the driving electrodes and the sensing electrode are formed entirely from both ends of the vibrating body to the center portion thereof.

The above tuning bar vibrator may further include a long first detection unit that extends in a direction that intersects with a longitudinal direction of the vibrating body at a substantially middle portion of the vibrating body in the longitudinal direction, wherein the sensing electrode may be formed on the one principal surface of the first detection unit. By forming the long first detection unit that extends in a direction that intersects with the longitudinal direction of the vibrating body at substantially the middle portion of the vibrating body in the longitudinal direction thereof, when a rotational angular velocity is applied to the tuning bar vibrator that bends and vibrates, Coriolis force acts on the first detection unit. Thus, the first detection unit deforms in correspondence with Coriolis force, a signal corresponding to the Coriolis force is generated in the first detection unit, and then the signal is output from the sensing electrode.

In addition, a second detection unit may be formed so as to be connected to each end of the first detection unit and may be formed so as to extend in the longitudinal direction of the vibrating body on each side of the vibrating body in a width direction thereof. By forming the second detection unit at each end of the first detection unit, it is possible to increase deformation of the first detection unit due to Coriolis force, so it is possible to output a further large signal corresponding to Coriolis force from the sensing electrode.

The vibrating body may be formed by adhering two piezoelectric substrates, and the two piezoelectric substrate adjacent to the one principal surface of the vibrating body and adjacent to the other principal surface of the vibrating body may be polarized in opposite directions with respect to each other in a thickness direction thereof. Moreover, the vibrating body may be formed by adhering a piezoelectric substrate and a non-piezoelectric substrate that are polarized in a thickness direction thereof. Furthermore, the vibrating body may be formed of a thin film that includes a piezoelectric film. The vibrating body just needs to be configured to bend and vibrate by a driving signal. Thus, the vibrating body may be formed by adhering two piezoelectric substrates or the vibrating body may be formed by adhering a piezoelectric substrate and a non-piezoelectric substrate. Furthermore, by forming the vibrating body in a thin-film structure, it is possible to reduce the profile of the tuning bar vibrator.

In addition, the invention provides a vibrating gyroscope. The vibrating gyroscope includes: the tuning bar vibrator according to any one of the above described structures; a driving unit (or driving means) for applying a driving signal between the driving electrodes of the tuning bar vibrator; and a detection unit (or detection means) for detecting a signal generated between the sensing electrode and the metal film. owing to the driving signal applied from the driving unit, the tuning bar vibrator bends and vibrates. When a rotational angular velocity is applied, the sensing electrode outputs a detection signal corresponding to Coriolis force. The detection signal is detected by the detecting unit. Thus, from the detection signal corresponding to Coriolis force, detected by the detecting unit, a rotational angular velocity applied to the tuning bar vibrator may be known.

According to the invention, even when the tuning bar vibrator is miniaturized, it is possible to prevent the resonant frequency from being increased. Hence, when the tuning bar vibrator is used, it is possible to obtain the miniaturized vibrating gyroscope having a desirable sensitivity. Furthermore, by forming the vibrating body of the tuning bar vibrator in a thin-film structure, it is possible to reduce the profile of the tuning bar vibrator. Hence, when the tuning bar vibrator is used, it is possible to obtain the vibrating gyroscope with a reduce profile.

The above object, other objects, features and advantages of the invention will be described with reference to the accompanying drawings. These will become apparent in greater detail from the description of a best mode for carrying out the invention as described below.

Figure 1:
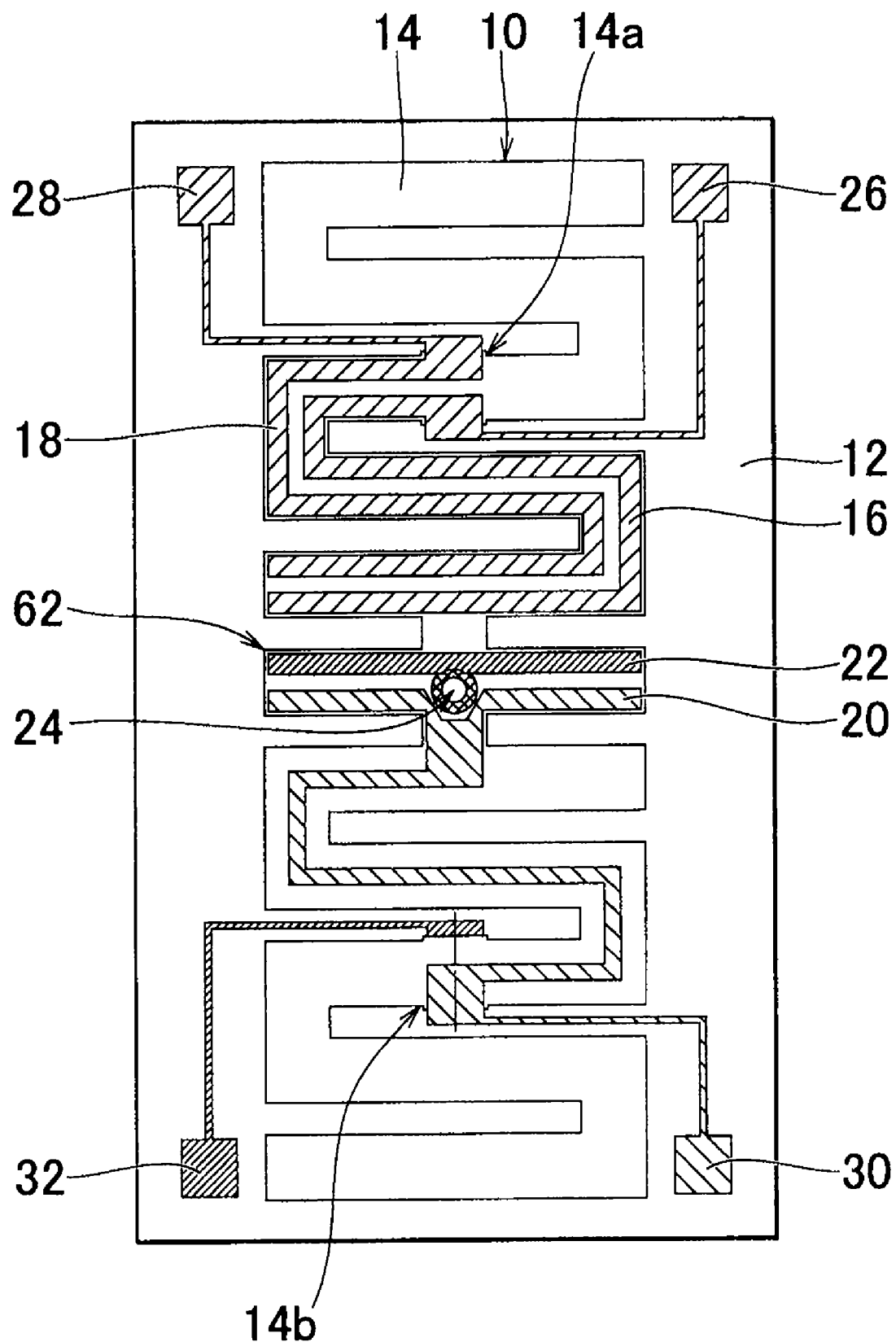
FIG. 1 is a plan view that shows an example of a tuning bar vibrator of the invention.

REFERENCE NUMERALS 10 tuning bar vibrator
12 substrate
14 vibrating body
16, 18 driving electrode
20 sensing electrode
22 common electrode
34 cavity portion
36 $SiO_2$ film
38 piezoelectric film
50 vibrating gyroscope
52 oscillation circuit
54 differential circuit (differential amplifier circuit)
56 synchronous detection circuit
58 smoothing circuit 60 DC amplifier
62 first detection unit
64 second detection unit

DETAILED DESCRIPTION OF THE INVENTION

Figure 2:
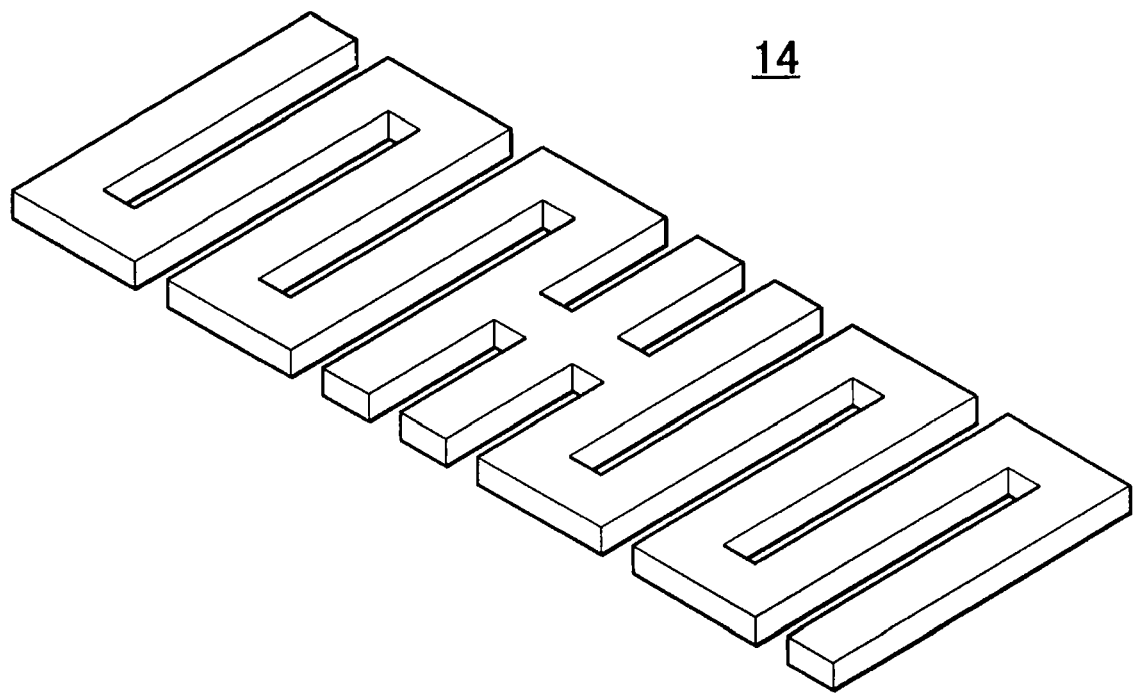
FIG. 2 is a perspective view that shows a vibrator body used in the tuning bar vibrator shown in FIG. 1.

FIG. 1 is a plan view that shows an example of a tuning bar vibrator of the invention. The tuning bar vibrator 10 is, for example, supported on a rectangular plate-like substrate 12 in a hollow form. The tuning bar vibrator 10 includes a vibrating body 14. The vibrating body 14 is, for example, formed to be a thin film structure with an SiO$_2$ film and a piezoelectric film. The vibrating body 14 is formed in a meander shape overall, as shown in FIG. 2. That is, a plurality of rectangular vibrating reeds are arranged parallel to one another, and the middle vibrating reed is connected to the adjacent vibrating reeds at the centers. In addition, at both sides of the connected three vibrating reeds, the respective vibrating reeds are connected alternately at different ends to form a serpentine meander shape. On both sides of the middle vibrating reed, adjacent vibrating reeds are connected at opposite ends with respect to each other so as to be formed symmetrically with respect to the center point of the middle vibrating reed.

The vibrating body 14 is excited to undergo bending vibration. The vibrating body 14 is supported on the substrate 12 at two portions, which are nodes of the bending vibration. Two driving electrodes 16 and 18 are formed so as to extend from one support portion 14a of the vibrating body 14 to the vibrating reed adjacent to the middle vibrating reed. These driving electrodes 16 and 18 are split in the width direction of each vibrating reed and parallel to each other to thereby form a meander shape. In addition, on one principal surface of the middle vibrating reed, a sensing electrode 20 and a common electrode 22 are formed so as to be split into both sides in the width direction of middle vibrating reed, that is, both side in the longitudinal direction of the vibrating body 14 as a whole. The sensing electrode 20 is formed so as to extend in a meander shape on the other side of the vibrating reeds with respect to the driving electrodes 16 and 18 and is formed to the other support portion 14b. Note that the support portions 14a and 14b are made of metal, resin, or the like and formed in a column shape.

The common electrode 22 is formed of a metal film on the other principal surface of the vibrating body 14. Then, a through-hole 24 is formed in the middle vibrating reed of the vibrating body 14. The common electrode 22 formed on the other principal surface of the vibrating body 14 is connected to the common electrode 22 formed on the one principal surface of the middle vibrating reed via the through-hole 24.

At the one support portion 14a of the vibrating body 14, the two driving electrodes 16 and 18 are respectively connected to extended electrodes 26 and 28 that are extended onto the substrate 12. The extended electrodes 26 and 28 are arranged respectively at both sides of the vibrating body 14 in the width direction, and are extended to one end side of the vibrating body 14 in the longitudinal direction. On the other hand, at the other support portion 14b of the vibrating body 14, the sensing electrode 20 is connected to an extended electrode 30 that is extended onto the substrate 12. In addition, at the other support portion 14b of the vibrating body 14, the common electrode 22 formed on the other principal surface of the vibrating body 14 is connected to an extended electrode 32 that is extended onto the substrate 12. The extended electrodes 30 and 32 are respectively arranged at both sides of the vibrating body 14 in the width direction, and are extended to the other end side of the vibrating body 14 in the longitudinal direction.

Figure 3:
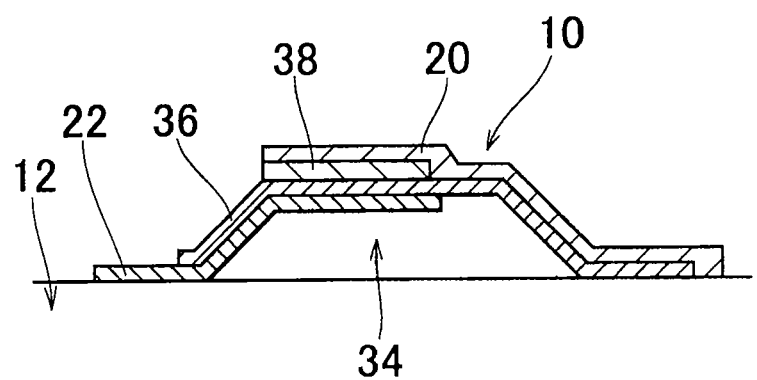
FIG. 3 is a cross-sectional view of the tuning bar vibrator at a support portion, taken along the alternate long and short dashed lines in FIG. 1.

FIG. 3 is a cross-sectional view of the substrate 12 of the tuning bar vibrator 10 in the longitudinal direction at the other support portion 14b of the vibrating body 14, taken along the alternate long and short dashed lines in FIG. 1. The tuning bar vibrator 10 is formed on the substrate 12 via, for example, a cavity portion 34 having a trapezoidal cross section. Thus, the common electrode 22 is formed on the substrate 12. The common electrode 22 is formed so as to extend obliquely upward from the substrate 12 and then extend substantially parallel to the principal surface of the substrate 12. A portion of the common electrode 22, which contacts the substrate 12, is formed continuously with the extended electrode 32.

An SiO$_2$ film 36 is formed on the common electrode 22. The SiO$_2$ film 36 is formed so as to cover the cavity portion 34. The SiO$_2$ film 36 is formed so as to cover portions of the common electrode 22 from the portion extending upward to the portion substantially parallel to the principal surface of the substrate 12. Furthermore, the SiO$_2$ film 36 is formed so as to extend obliquely downward to the substrate 12 on the opposite side with respect to the common electrode 22. In addition, a piezoelectric film 38 made of, for example, AlN is formed on the SiO$_2$ film 36. The piezoelectric film 38 is formed in the portion substantially parallel to the principal surface of the substrate 12 at a position facing the common electrode 22. In addition, the sensing electrode 20 is formed on the piezoelectric film 38. The sensing electrode 20 is formed over the piezoelectric film 38 to the SiO$_2$ film 36, and is extended onto the substrate 12 at the other side with respect to the side at which the common electrode 22 is extended. Then, the sensing electrode 20 extended onto the substrate 12 is formed so as to be continuous with the extended electrode 30. As shown in FIG. 3, a region in which the common electrode 22, the SiO$_2$ film 36, the piezoelectric film 38 and the sensing electrode 20 overlap one another constitute the vibrating body 14.

In addition, at the one support portion 14a of the vibrating body 14, the two driving electrodes 16 and 18 are formed on the piezoelectric film 38 and spaced apart from each other, and extended to both sides of the SiO$_2$ film 36, respectively. The driving electrodes 16 and 18 extended to both sides of the SiO$_2$ film 36 are formed so as to be continuous with the extended electrode 26 and 28, respectively. At portions other than the two support portions 14a and 14b, the vibrating body 14 is formed with lamination of the common electrode 22, the SiO$_2$ film 36, the piezoelectric film 38, and the driving electrodes 16 and 18 or the sensing electrode 20 while being spaced apart from the substrate 12. Thus, at these portions, the vibrating body 14 or each electrode is not in contact with the substrate 12.

In order to manufacture the tuning bar vibrator 10, a ZnO thin film is formed on the substrate 12. The ZnO thin film supports the tuning bar vibrator 10 in a hollow manner at the support portions, and is spaced apart from the substrate 12 at portions other than the support portions to be a so-called sacrifice layer that is removed in the following process in order to form the tuning bar vibrator 10. The ZnO thin film is, for example, formed on the substrate 12 by epitaxial growth, or the like. The ZnO thin film is patterned into the shape of the tuning bar vibrator 10 by reactive ion etching (RIE), or the like.

A metal film, such as Au, is formed on the ZnO thin film by thin-film technology such as RF magnetron sputtering, plating, or vapor deposition to thereby form the common electrode 22. At this time, the extended electrode 32 is also formed so as to be extended from the common electrode 22 onto the substrate 12. Furthermore, the SiO$_2$ film 36 and the piezoelectric film 38 are sequentially formed on the common electrode 22 by thin-film technology. These common electrode 22, SiO$_2$ film 36 and piezoelectric film 38 are also patterned into predetermined shapes by RIE, or the like. Furthermore, the through-hole 24 is formed at the center of the SiO$_2$ film 36 and the piezoelectric film 38 to connect the upper and lower layers of the common electrodes 22. Then, a metal film made of Au, or the like, is formed on the piezoelectric film 38 by thin-film technology. The metal film is patterned into a predetermined shape to thereby form the driving electrodes 16 and 18, the sensing electrode 20, and the common electrode 22 formed on one principal surface of the vibrating body 14. At this time, a metal film is also formed in the through-hole 24 to connect the upper and lower layers of the common electrode 22. Furthermore, when a metal film is formed, the extended electrodes 26, 28 and 30 are also formed on the substrate 12. Finally, the ZnO film is removed by etching, or the like, to thereby complete the tuning bar vibrator 10.

Figure 4:
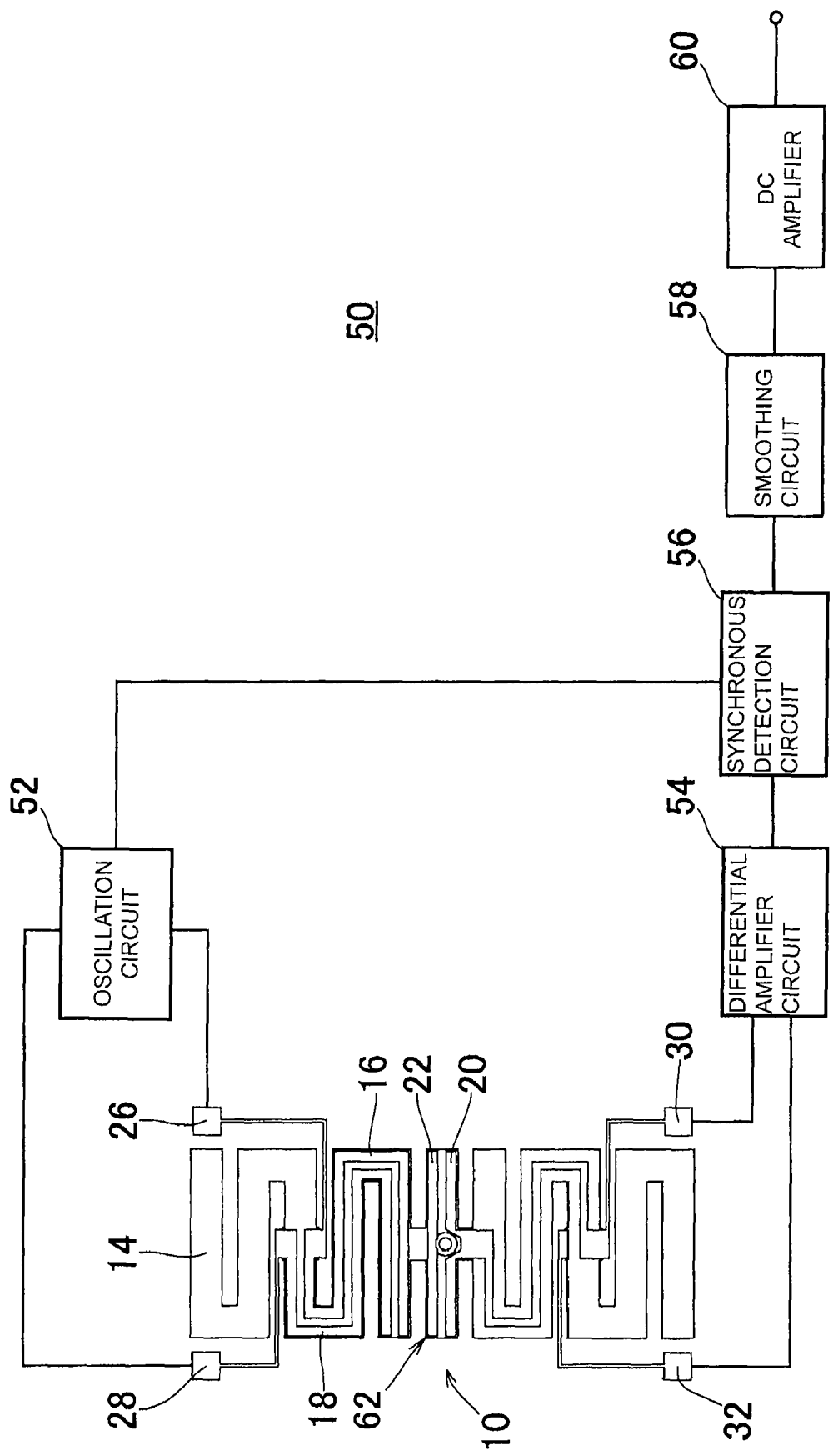
FIG. 4 is a diagram that illustrates an example of a vibrating gyroscope that uses the tuning bar vibrator shown in FIG. 1.

The tuning bar vibrator 10 is, for example, used as a vibrating gyroscope 50 as shown in FIG. 4. In this case, an oscillation circuit 52, which serves as a driving unit, is connected to the extended electrodes 26 and 28 that are respectively connected to the driving electrodes 16 and 18. The oscillation circuit 52 includes an AGC circuit, a phase correction circuit, a driving amplifier circuit, and the like. Then, the vibrating body 14, the driving electrodes 16 and 18, the extended electrodes 26 and 28 and the oscillation circuit 52 form a self-oscillating loop.

Furthermore, the extended electrodes 30 and 32 connected respectively to the sensing electrodes 20 and the common electrode 22 are connected to a differential amplifier circuit 54. An output signal of the differential amplifier circuit 54 is input to a synchronous detection circuit 56. The synchronous detection circuit 56 is connected to the oscillation circuit 52 and detects an output signal of the differential amplifier circuit 54 in synchronization with a signal of the oscillation circuit 52. Furthermore, a smoothing circuit 58 and a DC amplifier 60 are serially connected to the synchronous detection circuit 56. The differential amplifier circuit 54, synchronous detection circuit 56, smoothing circuit 58, DC amplifier 60, and the like, form a detection unit for detecting a signal corresponding to a rotational angular velocity. Note that the signal corresponding to the rotational angular velocity is generated at the middle vibrating reed at which the sensing electrode 20 and the common electrode 22 are formed, so the middle vibrating reed is a first detection unit 62 for detecting a rotational angular velocity.

Figure 5:
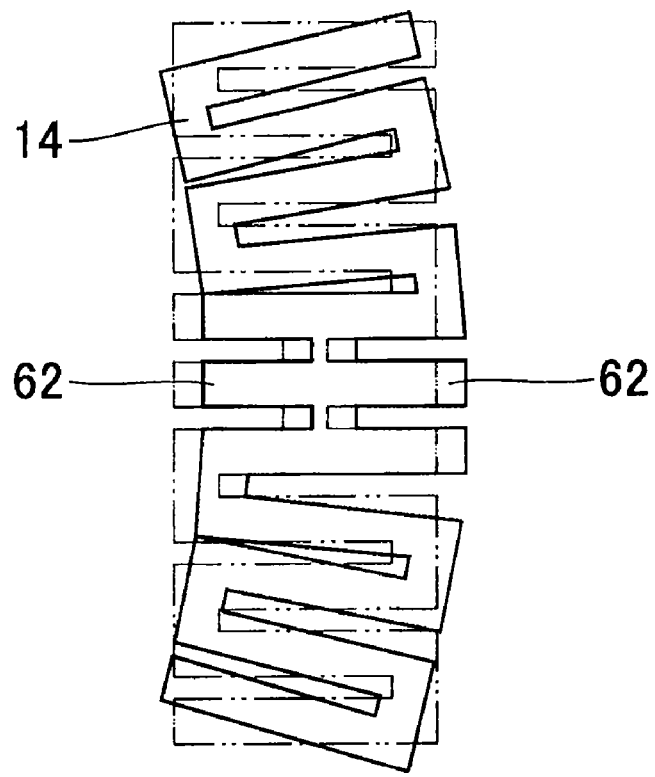
FIG. 5 is a view that illustrates a state in which a vibrating body bends and vibrates.

In the vibrating gyroscope 50, bending vibration is excited in the tuning bar vibrator 10 by the self-oscillation loop that includes the oscillation circuit 52. The bending vibration is excited within a plane parallel to the principal surface of the vibrating body 14 with respect to two nodes of the vibrating body 14 as shown in FIG. 5. At this time, the position of the first detection unit 62 is displaced by bending vibration of the vibrating body 14; however, the shape thereof is not deformed.

In this state, when a rotational angular velocity is applied about the axis directed perpendicularly to the principal surface of the vibrating body 14, Coriolis force acts in a direction perpendicular to the direction of the bending vibration within the plane parallel to the principal surface of the vibrating body 14. Owing to the Coriolis force, the first detection unit 62 is deformed so as to bend in the longitudinal direction of the vibrating body 14. Because the amount of deformation of the first detection unit 62 corresponds to Coriolis force, a signal corresponding to the Coriolis force is generated between the sensing electrode 20 and the common electrode 22. Thus, the differential circuit 54 outputs the signal corresponding to the Coriolis force.

The signal due to the Coriolis force is synchronously detected by the synchronous detection circuit 56, smoothed in the smoothing circuit 58 and then amplified in the DC amplifier 60. Thus, by measuring an output signal of the DC amplifier 60, it is possible to detect a rotational angular velocity applied to the tuning bar vibrator 10.

In the tuning bar vibrator 10, because portions on both sides of the first detection unit 62 located at the middle of the vibrating body 14 are formed into a meander shape, the serpentine length of the vibrator may be longer than the linear length of the vibrating body 14 as a whole. Thus, even when the size of the tuning bar vibrator 10 is reduced, it is possible to ensure the long length of the vibrator. Hence, it is possible to prevent the resonant frequency of the tuning bar vibrator 10 from increasing.

Thus, when the tuning bar vibrator 10 is used, even when it is reduced in size, it is possible to obtain the vibrating gyroscope 50 with a low resonant frequency. Thus, when the vibrating gyroscope 50 is mounted on a video camera, or the like, it is possible to excite the tuning bar vibrator 10 with a resonant frequency that has a small difference from a frequency of hand jiggling. Hence, it is possible to obtain the miniaturized vibrating gyroscope 50 having a desirable sensitivity against hand jiggling. In addition, by employing a thin-film structure formed of the SiO$_2$ film 36 and the piezoelectric film 38, which serve as piezoelectric substances, it is possible to achieve a reduction in profile of the tuning bar vibrator 10. Furthermore, by employing the SiO$_2$ film and the piezoelectric film 38, the tuning bar vibrator may be manufactured through a thin-film process. Thus, it is easy to miniaturize the tuning bar vibrator 10.

Figure 6:
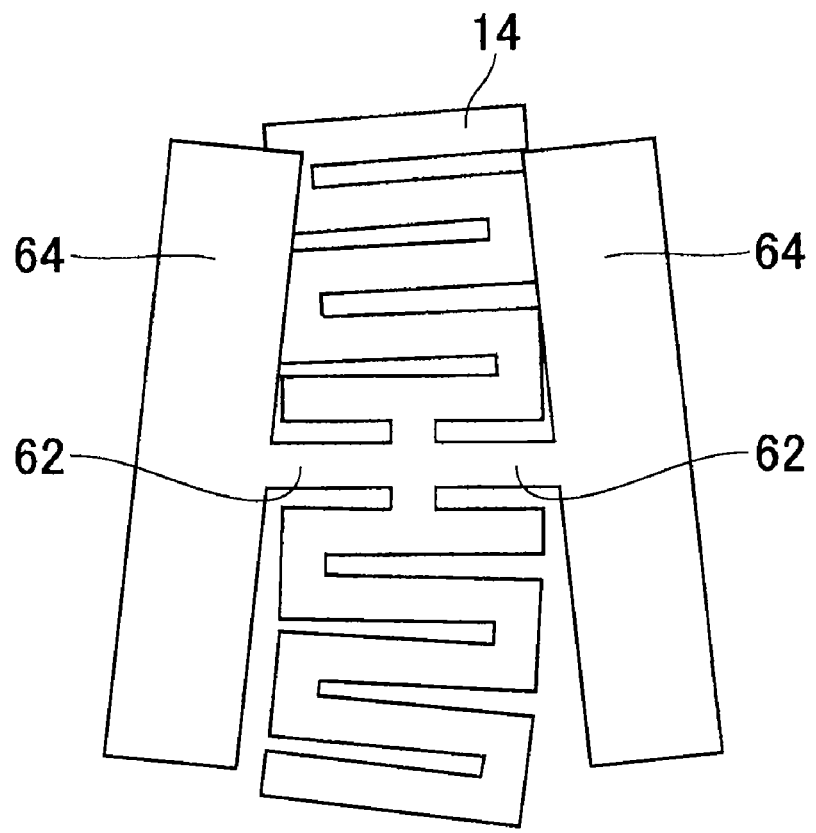
FIG. 6 is a view that illustrates a state in which the vibrating body having second detection units vibrates.

In the above vibrating gyroscope 50, as shown in FIG. 6, a second detection unit 64 may be formed on each side of the first detection unit 62. The second detection units 64 are formed respectively along both sides in the width direction of the vibrating body 14. The second detection unit 64, when Coriolis force acts, serves as a weight that increases deformation of the first detection unit 62. Thus, when a rotational angular velocity is applied to the tuning bar vibrator 10, the first detection unit 62 largely deforms due to Coriolis force and, as a result, it is possible to obtain a large signal from the differential circuit 54. Hence, when the tuning bar vibrator 10 is used, it is possible to obtain the vibrating gyroscope 50 having a desirable sensitivity. Note that the second detection units 64 operate as weights as described above and, therefore, electrodes need not be formed thereon.

Figure 7:
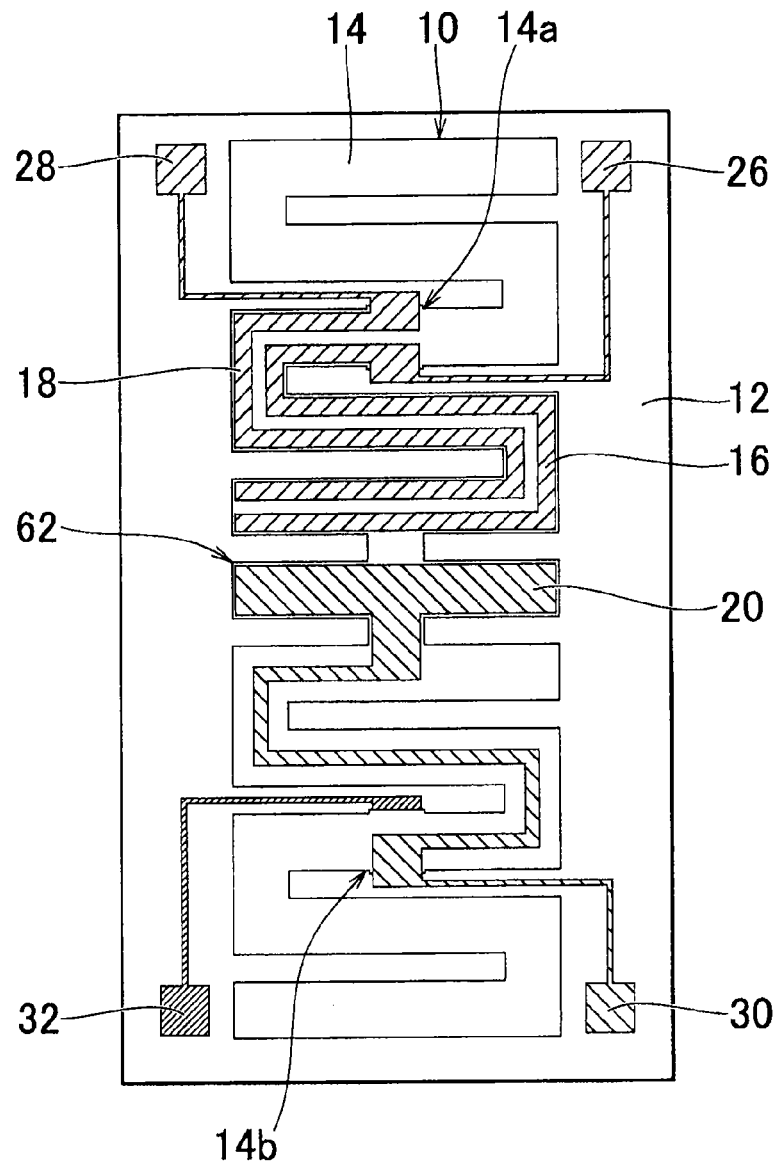
FIG. 7 is a plan view that shows another example of the tuning bar vibrator of the invention.
Figure 8:
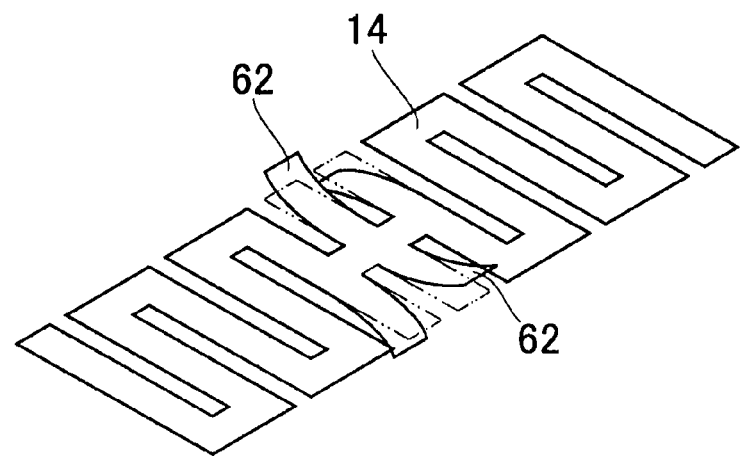
FIG. 8 is a view that illustrates a state in which the vibrating body of the vibrating gyroscope that uses the tuning bar vibrator shown in FIG. 7 vibrates.

In addition, as shown in FIG. 7, the sensing electrode 20 may be formed substantially over the entire one principal surface of the first detection unit 62, and the common electrode may be formed on the other principal surface. In the vibrating gyroscope 50 that uses the above tuning bar vibrator 10, a rotational angular velocity about an axis extending in the longitudinal direction of the tuning bar vibrator 10 is detected. That is, when such a rotational angular velocity is applied in a state where the tuning bar vibrator 10 bends and vibrates as shown in FIG. 5, Coriolis force acts in a direction perpendicular to the principal surface of the tuning bar vibrator 10. Thus, as shown in FIG. 8, the first detection unit 62 bends in its thickness direction and, therefore, a signal is generated between the sensing electrode 20 and the common electrode 22, which face each other in the first detection unit 62. Because the signal is output from the differential circuit 54, by measuring an output signal of the DC amplifier 60, it is possible to detect a rotational angular velocity applied to the tuning bar vibrator 10.

Note that because AlN formed as the piezoelectric film 38 has a negative temperature coefficient of Young's modulus, the frequency of a detected signal varies depending on temperature. This may inhibit accurate detection of a rotational angular velocity. Then, by combining it with the $SiO_2$ film 36 having a positive temperature coefficient of Young's modulus, it is possible to stabilize the temperature characteristic of the frequency of a detected signal.

The vibrating body 14 need not be the one such that the $SiO_2$ film 36 and the piezoelectric film 38 are formed through a thin-film process. For example, two piezoelectric substrates having the shape of the vibrating body 14 may be laminated and then these piezoelectric substrates may be polarized in opposite directions with respect to each other in the thickness direction. In addition, the vibration body 14 may be formed by laminating a piezoelectric substrate having the shape of the vibrating body 14 and a non-piezoelectric substrate. Even with the tuning bar vibrator 10 using the above vibrating body 14, by forming both side portions to the first detection unit 62 into a meander shape, it is possible to ensure the long length of a vibrator. Thus, it is possible to obtain a miniaturized tuning bar vibrator with a low resonant frequency.

Figure 9:
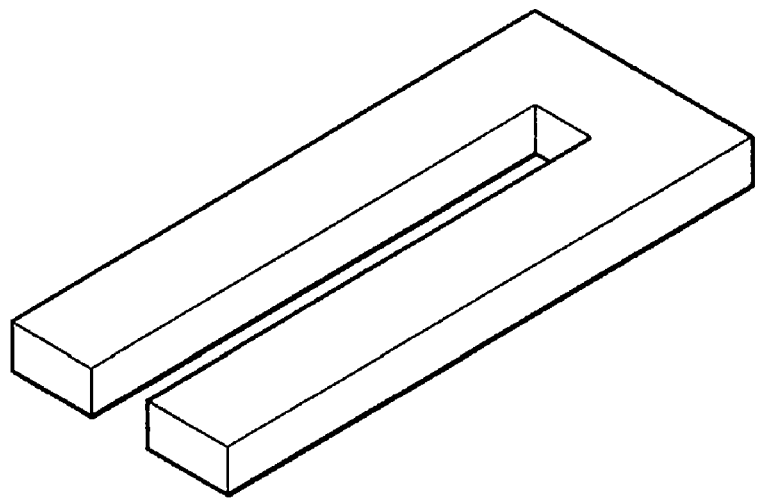
FIG. 9 is a perspective view that shows an example of a connecting portion of a vibrating reed that constitutes the vibrating body.
Figure 10:
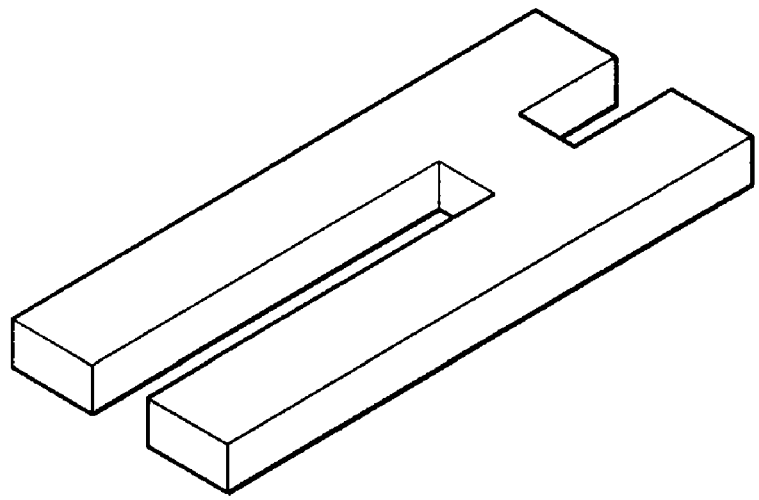
FIG. 10 is a perspective view that shows another example of a connecting portion of a vibrating reed that constitutes the vibrating body.
Figure 11:
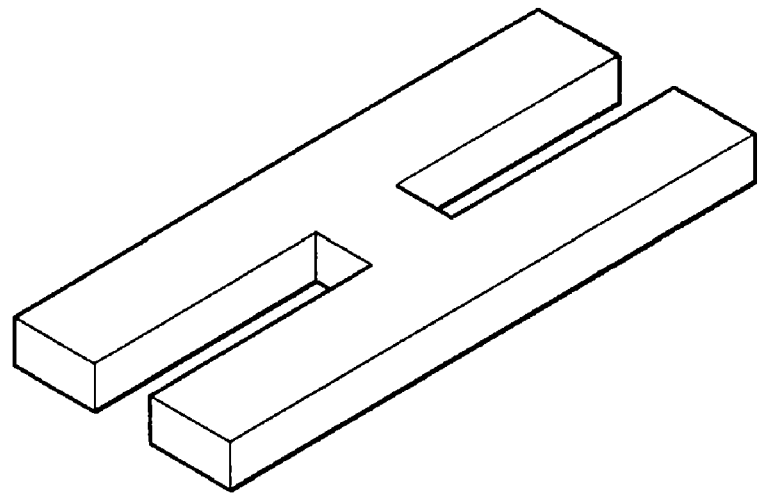
FIG. 11 is a perspective view that shows further another example of a connecting portion of a vibrating reed that constitutes the vibrating body.
Figure 12:
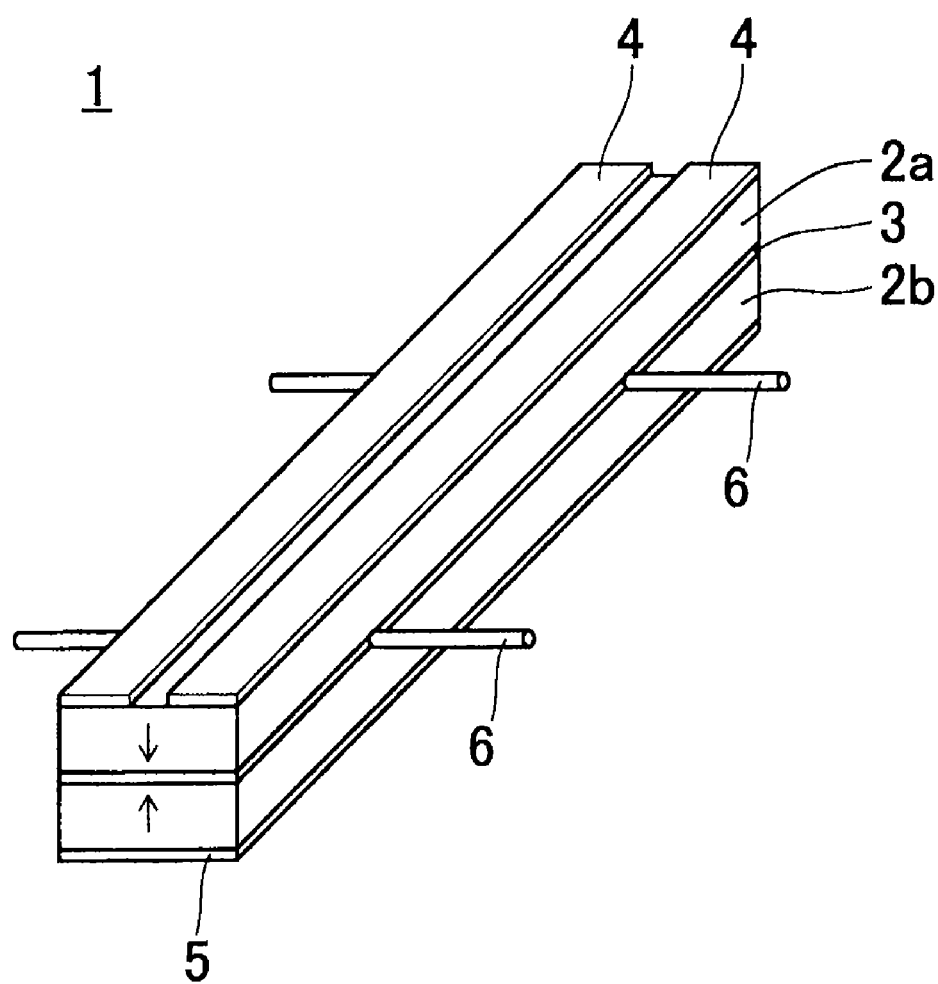
FIG. 12 is a perspective view that shows an example of an existing tuning bar vibrator.

In addition, as for the connecting portions of the parallel arranged vibrating reeds that constitute the vibrating body 14, as shown in FIG. 9, the vibrating reeds may be connected at their ends. In addition, as shown in FIG. 10, the vibrating reeds may be connected at portions between the end and the center, or as shown in FIG. 11, the vibrating reeds may be connected at the centers. In the vibrating body 14 used in the above described tuning bar vibrator 10, the middle vibrating reed and its adjacent vibrating reeds are connected at the centers as shown in FIG. 11, and the vibrating reeds on both sides of the above vibrating reeds are connected at their ends as shown in FIG. 9. However, the portions of the vibrating reeds, connected at their ends, may be connected at the connecting portion as shown in FIG. 10, and in this case as well, it is possible to increase the serpentine length of a vibrator. Note that as in the case of the tuning bar vibrator 10 shown in FIG. 1, by combining the connections of the vibrating reeds as shown in FIG. 9 and FIG. 11, it is possible to maximally increase the serpentine length of a vibrator against the linear length of the vibrating body 14.

The invention claimed is:

1. A tuning bar vibrator comprising:
    a meander-shaped vibrating body having a first principal surface and a second principal surface;
    two driving electrodes extending from a first end side of the first principal surface of the vibrating body in a longitudinal direction thereof to a middle portion of the first principal surface of the vibrating body, the two driving electrodes being separated in a width direction of the vibrating body;
    a sensing electrode that extending from a second end side of the first principal surface of the vibrating body in the longitudinal direction thereof to the middle portion of the first principal surface;
    a metal film on the second principal surface of the vibrating body; and
    a support portion located at a portion of the vibrating body corresponding to a node when the vibrating body bends and vibrates, and that supports the vibrating body.

2. The tuning bar vibrator according to claim 1, wherein the vibrating body comprises a plurality of vibrating reeds arranged parallel to each other.

3. The tuning bar vibrator according to claim 2, wherein a middle vibrating reed of the plurality of vibrating reeds is connected to adjacent vibrating reeds at a center thereof.

4. The tuning bar vibrator according to claim 3, wherein the plurality of vibrating reeds other than the middle vibrating reed are connected alternatively at different ends thereof.

5. The tuning bar vibrator according to claim 3, wherein the plurality of vibrating reeds other than the middle vibrating reed are connected alternatively between different ends and a center thereof.

6. The tuning bar vibrator according to claim 2, wherein the plurality of vibrating reeds other than a middle vibrating reed are connected alternatively at different ends thereof.

7. The tuning bar vibrator according to claim 2, wherein the plurality of vibrating reeds other than a middle vibrating reed are connected alternatively between different ends and a center thereof.

8. The tuning bar vibrator according to claim 1, further comprising a first detection unit that extends in a direction that intersects with the longitudinal direction of the vibrating body at a substantially middle portion of the vibrating body in the longitudinal direction, wherein the sensing electrode is formed on a surface of the first detection unit.

9. The tuning bar vibrator according to claim 8, further comprising a second detection unit connected to each end of the first detection unit and extending in the longitudinal direction of the vibrating body on each side of the vibrating body in a width direction thereof.

10. The tuning bar vibrator according to claim 1, wherein the vibrating body comprises two piezoelectric substrates.

11. The tuning bar vibrator according to claim 10, wherein, the two piezoelectric substrates are polarized in opposite directions with respect to each other in a thickness direction thereof.

12. The tuning bar vibrator according to claim 1, wherein the vibrating body comprises a piezoelectric substrate and a non-piezoelectric substrate.

13. The tuning bar vibrator according to claim 12, wherein the piezoelectric substrate and the non-piezoelectric substrate are polarized in a thickness direction thereof.

14. The tuning bar vibrator according to claim 1, wherein the vibrating body comprises a piezoelectric film.

15. A vibrating gyroscope comprising:
    the tuning bar vibrator according to claim 1;
    a driving unit that applies a driving signal between the two driving electrodes of the tuning bar vibrator; and
    a detection unit that detects a signal generated between the sensing electrode and the metal film.

* * * * *